(12) United States Patent
Juang et al.

(10) Patent No.: US 9,118,338 B2
(45) Date of Patent: Aug. 25, 2015

(54) OFFSET COMPENSATION CIRCUIT AND METHOD THEREOF

(71) Applicant: National Applied Research Laboratories, Hsinchu (TW)

(72) Inventors: Ying-Zong Juang, Hsinchu (TW); Hann-Huei Tsai, Hsinchu (TW); Po-Chang Wu, Hsinchu (TW); Chih-Yuan Yeh, Hsinchu (TW); Kuei-Cheng Lin, Hsinchu (TW)

(73) Assignee: NATIONAL APPLIED RESEARCH LABORATORIES, Hsinchu (TW)

( * ) Notice: Subject to any disclaimer, the term of this patent is extended or adjusted under 35 U.S.C. 154(b) by 0 days.

(21) Appl. No.: 14/175,279

(22) Filed: Feb. 7, 2014

(65) Prior Publication Data
US 2015/0171885 A1     Jun. 18, 2015

(30) Foreign Application Priority Data
Dec. 13, 2013   (TW) ............................ 102146120 A (51) Int. Cl.
*H03M 1/06*      (2006.01)
*H03F 3/45*      (2006.01)

(52) U.S. Cl.
CPC ............... *H03M 1/06* (2013.01); *H03F 3/456* (2013.01); *H03F 3/45748* (2013.01)

(58) Field of Classification Search
CPC . H03F 3/44596–3/456; H03F 3/45618–3/623; H03F 3/45744–3/45753; H03F 3/45766–3/45771; H03F 3/45892–3/45896; H03M 1/0607; H03M 1/06–1/0604; H03M 1/10–1/1019; H03M 1/1023
USPC .......................................................... 327/307
See application file for complete search history.

(56) References Cited

U.S. PATENT DOCUMENTS

| | | | | |
|---|---|---|---|---|
| 4,914,533 | A * | 4/1990 | Meunier | 360/67 |
| 6,642,767 | B2 * | 11/2003 | Wang | 327/307 |
| 6,795,843 | B1 * | 9/2004 | Groe | 708/801 |
| 7,193,467 | B2 * | 3/2007 | Garlepp et al. | 330/259 |
| 7,271,649 | B2 * | 9/2007 | Chiu et al. | 330/9 |

* cited by examiner

*Primary Examiner* — Howard Williams
(74) *Attorney, Agent, or Firm* — Lowe Hauptman & Ham, LLP (57) ABSTRACT

A current-steering offset compensation circuit is configured for compensating an offset caused by process variation or environment variation of a signal processor. The signal processor includes a pair of differential input terminals and a pair of differential output terminals. The current-steering offset compensation circuit comprises a current-steering circuit connected with the signal processor, a digital control unit which generates a digital control signal according to the outputs from the pair of differential output terminals of the signal processor, and a digital-to-analog converter which receives the digital control signal and outputs a control voltage, wherein the current-steering circuit receives the control voltage, so as to steer the current of the pair of differential input terminals, to reduce the offset in the signal processor.

13 Claims, 9 Drawing Sheets

OFFSET COMPENSATION CIRCUIT AND METHOD THEREOF

RELATED APPLICATIONS

This application claims priority to Taiwan Application Serial Number 102146120, filed Dec. 13, 2013, which is herein incorporated by reference.

FIELD OF THE INVENTION

The present invention relates to an offset compensation circuit and method thereof, in particular to a current-steering offset compensation circuit and method thereof.

BACKGROUND OF THE INVENTION

Sensors are commonly used for converting an externally physical quantity into an electric signal, so sensors are used widely in daily life and industry. The related products of sensors includes accelerometers, gyros, resonators, pressure sensors, respiratory sensors, magnetometers, temperature sensors, ambient light sensors, proximity sensors, etc.

Figure 1:
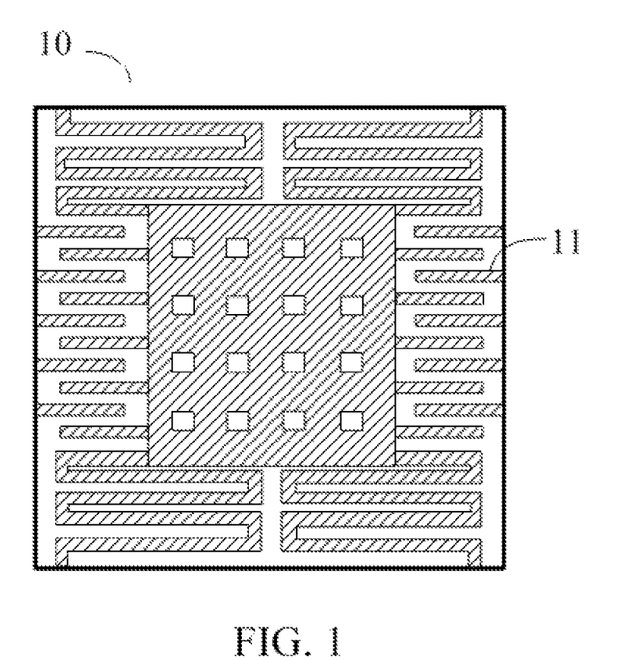
FIG. 1 shows the structure of a capacitive sensor chip.

A static or dynamic offset is generated by process variation or ambient environment variation of the sensor. For example, FIG. 1 shows a CMOS MEMS sensor chip 10, which is commonly applied to an accelerometer in a mobile phone. The sensor detects differential capacitances between an electrode 11 and adjacent electrodes when the mobile phone performs a relative movement. Hence, theoretically, if the mobile phone does not performs a relative movement, the capacitance between the electrode 11 and one of the adjacent electrodes is equivalent to the capacitance between the electrode 11 and the other adjacent electrodes. That is, in the design of the sensor chip 10, the area and the distances between the electrode 11 and the adjacent electrodes must be the same. However, in the actual process, the areas of each electrode are slightly different, and the distances between any two electrodes may be different. Even though the sensor does not perform a relative movement, differential capacitances occur between the electrode 11 and the adjacent electrodes. This phenomenon is called static offset of the sensor. On the other hand, when the ambient environment (such as temperature) of the sensor is changed, the capacitances between electrodes will be changed. This phenomenon is called dynamic offset of the sensor.

Figure 2:
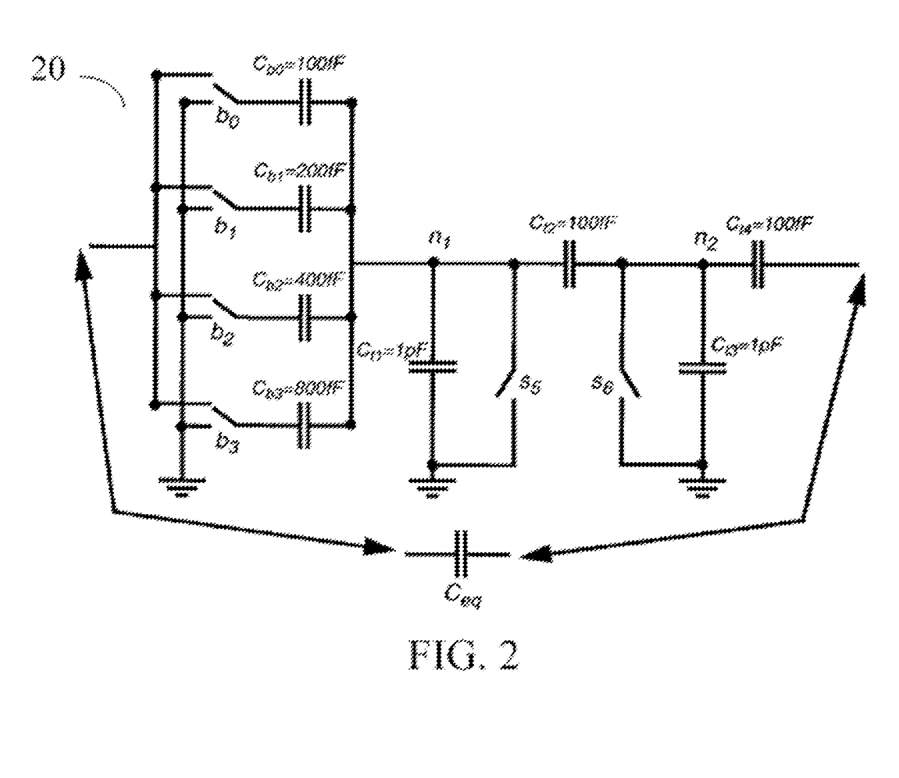
FIG. 2 illustrates a capacitance compensation circuit.

In the prior art, in order to solve the aforementioned problems, a capacitance compensation circuit is employed. FIG. 2 shows a capacitance compensation circuit 20. According to the outputs from the positive and negative output terminals of the sensor, the equivalent capacitance Ceq generated by the capacitance compensation circuit 20 is determined to compensate to the positive terminal or the negative terminal of the sensor. For example, when the voltage outputted by the negative terminal of the pair of differential output terminals of the sensor is greater than the voltage outputted by the positive terminal of the pair of differential output terminals, the equivalent capacitance Ceq will be compensated to the positive terminal of the sensor. However, in order to produce a tiny compensation capacitance, a capacitor network is employed. The capacitor network is configured with various capacitors and various switch elements, so that the capacitance compensation circuit 20 occupies a large area of the sensor chip. Moreover, the capacitance compensation circuit 20 is only constituted by a compensation capacitor array, so that an extra circuit for implementing the calibration algorithm is needed. That is, the capacitance compensation circuit 20 not only occupies large space, but also the minimum compensation value is restricted.

SUMMARY OF THE INVENTION

The object of the present invention is to provide an offset compensation circuit and method thereof, which is used for compensating the static and dynamic offset of the sensor.

To achieve the above object, the present invention provides a current-steering offset compensation circuit for compensating a differential offset of a signal processor, wherein the signal processor includes a pair of differential input terminals and a pair of differential output terminals. The current-steering offset compensation circuit includes: a current-steering circuit connected with the signal processor, a digital control unit which generates a digital control signal according to the outputs from the pair of differential output terminals of the signal processor; a digital-to-analog converter which receives the digital control signal and outputs a control voltage, wherein the current-steering circuit receives the control voltage, so as to control a correction current.

According to an aspect of the present invention, the current-steering offset compensation circuit further includes a comparator for receiving the differential outputs from the pair of the output terminals, so as to generate a comparison signal to the digital control unit. The digital control unit receives the comparison signal to generate the digital control signal.

According to another aspect of the present invention, the current-steering offset compensation circuit further includes a low pass filter for receiving the differential outputs from the pair of output terminals, so as to output low frequency differential signals to the digital control unit. The digital control unit generates the digital control signal according to the low frequency differential signals.

The present invention further provides a method for compensating an offset of a signal processor. The signal processor includes a pair of differential input terminals, a pair of differential output terminals, and a current-steering offset compensation circuit. The current-steering offset compensation circuit includes a current-steering circuit, a digital control unit, and a digital-to-analog converter. The method comprises the following steps:

S10: generating a digital control signal via the digital control unit according to the outputs from the pair of differential output terminals of the signal processor;

S20: receiving the digital control signal via the digital-to-analog converter, and outputting a control voltage;

S30: receiving the control voltage via the current-steering circuit, so as to control a correction current.

According to another aspect of the present invention, the current-steering offset compensation circuit includes a comparator. The method further comprises the following step before S10:

S40: generating a comparison signal via the comparator according to the outputs from the pair of differential output terminals of the signal processor.

According to another aspect of the present invention, the current-steering offset compensation circuit includes a low pass filter. The method further comprises the following step before S40:

S50: outputting low frequency differential signals via the low pass filter according to the outputs from the pair of differential output terminals of the signal processor.

DETAILED DESCRIPTION OF THE INVENTION

The present invention will now be described in detail with reference to a few preferred embodiments thereof as illustrated in the accompanying drawings. The same reference numerals refer to the same parts or like parts throughout the various figures.

Figure 3:
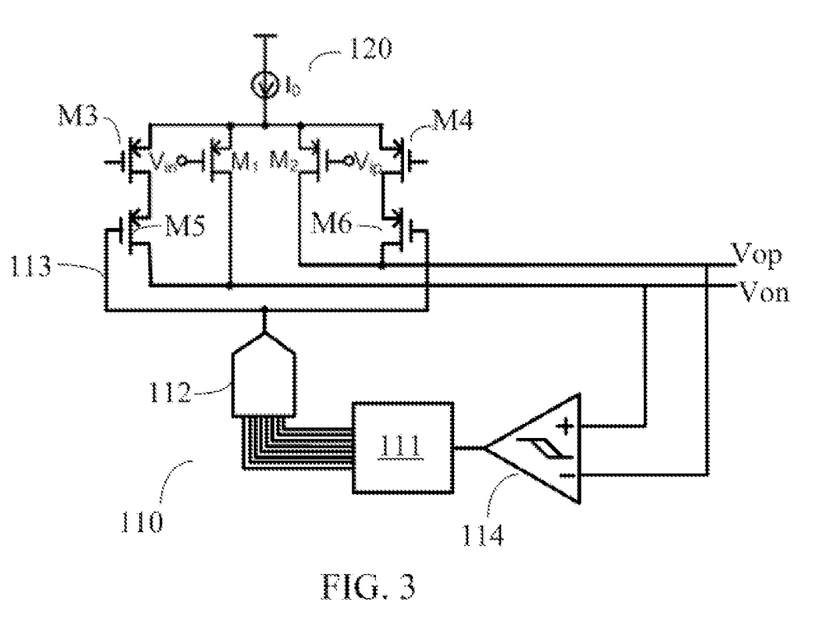
FIG. 3 illustrates a current-steering offset compensation circuit of the present invention.

Please refer to FIG. 3. FIG. 3 illustrates a current-steering offset compensation circuit 110 of the present invention. The current-steering offset compensation circuit 110 is connected with a signal processor 120, where an operational amplifier is shown, as an example. The signal processor 120 includes a current source Io, a pair of differential input terminals Vin and Vip, and a pair of differential output terminals Von and Vop, wherein the signal processor 120 further includes a pair of transistors M1 and M2. The negative input terminal Vin of the signal processor 120 inputs a voltage to the transistor M1, and the positive input terminal Vip inputs a voltage to the transistor M2, so that the transistors M1 and M2 respectively output current to the pair of differential output terminals Von and Vop of the signal processor 120. Ideally, the current value outputted by the transistor M1 is the same as the current value outputted by the transistor M2. However, in practice, an offset caused by process variation or ambient environment (such as temperature) of a sensor or the signal processor 120 occurs in the static current outputted by the transistors M1 and M2. Therefore, the present invention provides the current-steering offset compensation circuit 110 for compensating the offset of current.

The current-steering offset compensation circuit 110 includes a digital control unit 111, a digital-to-analog converter 112, and a current-steering circuit 113. Optionally, the current-steering offset compensation circuit 110 may further include a comparator 114.

Please refer to FIG. 3. The comparator 114 receives the outputs from the pair of differential output terminals Von and Vop of the signal processor 120, detects an offset from the differential outputs of the signal processor 120, and thus generates a comparison signal which is composed of either "0" or "1" to the digital control unit 111, wherein the comparator 114 preferably is a hysteresis comparator which can avoid the correction stability being influenced by noise. According to the comparison signal of the comparator 114, the digital control unit 111 determines if the current should be compensated to the positive or the negative input terminal and the amount of the compensation value, so as to generate a digital control signal. The digital control unit 111 transmits the digital control signal to the digital-to-analog converter 112, and controls the input digital code of the digital-to-analog converter 112, so the digital-to-analog converter 112 starts to input a control voltage. It is advantageous to use the digital control unit 111, to execute a function of algorithm, such as a rapid SAR algorithm, so that the requirement of linearity for the design of the digital-to-analog converter 112 is not so strict.

The current-steering circuit 113 includes an input stage and an output stage, wherein the input stage includes a first transistor M3 and a second transistor M4, the output stage includes a third transistor M5 and a fourth transistor M6. When the digital control unit 111 judges that the current should be compensated to the negative terminal of the signal processor 120, the first transistor M3 is turned on by the digital control unit 111 with the digital control signal. Therefore, the third transistor M5 coupled with the first transistor M3 receives the control voltage, and thus outputs a correction current having a first value. In the same way, when the digital control unit 111 judges that the current should be compensated to the positive terminal of the signal processor 120, the second transistor M4 is turned on by the digital control unit 111 with the digital control signal. Therefore, the fourth transistor M6 coupled with the second transistor M4 receives the control voltage, and thus outputs a correction current having a second value. Finally, when the digital control unit 111 detects that a state transition occurs in the comparison signal of the comparator 114, the correction of the signal processor 120 is completed. That is, the corrective action is stopped; the state of the output from the signal processor 120 is stable. The voltages from the pair of differential output terminals Von and Vop approximate to each other, and the offset of the pair of differential output terminals is nearly 0V. Therefore, the minimum compensation value of the current-steering offset compensation circuit 110 is determined by the resolution of the comparator 114.

Figure 4:
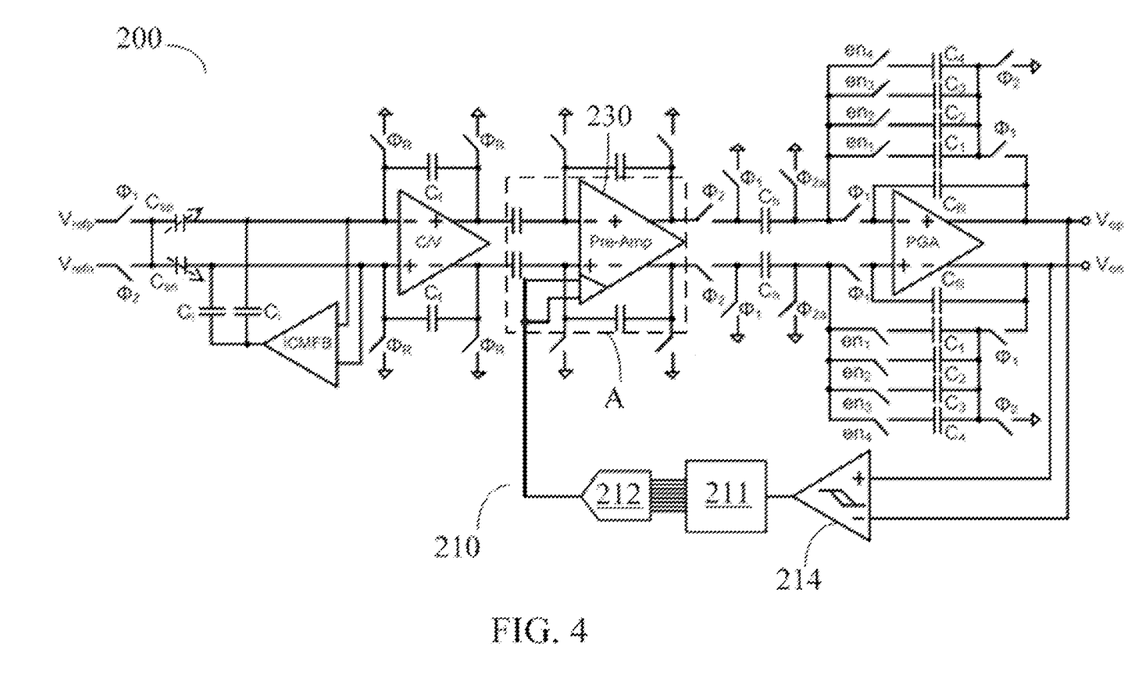
FIG. 4 illustrates a first embodiment of the current-steering offset compensation circuit of the present invention.

Please refer to FIG. 4. FIG. 4 illustrates a first embodiment of the present invention. The acceleration reading circuits 200 is configured for transforming an external physical quantity (such as acceleration or angular velocity) into an electric signal. When the related movement occurs, the outputs of two front-end capacitors Csp and Csn of the acceleration reading circuits 200 is changed. The pair of the capacitors Csp and Csn differential output a pair of capacitances, which are transformed to a pair of voltage signals by a capacitance-to-voltage (C/V) converter circuit, and then the pair of voltage signals are amplified and outputted by a preamplifier (Pre-Amp) 230 and a programmable gain amplifier (PGA). However, the pair of differential output capacitances Csn and Csp are inconsistent while the acceleration is zero, so an offset occurs from the pair of voltage signals outputted by the capacitance-to-voltage (C/V) converter circuit. The offset is amplified via the preamplifier (Pre-Amp) 230 and the programmable gain amplifier (PGA). Therefore, the present invention provides the current-steering offset compensation circuit 210 for compensating the differential offset of the acceleration reading circuits 200.

Figure 5:
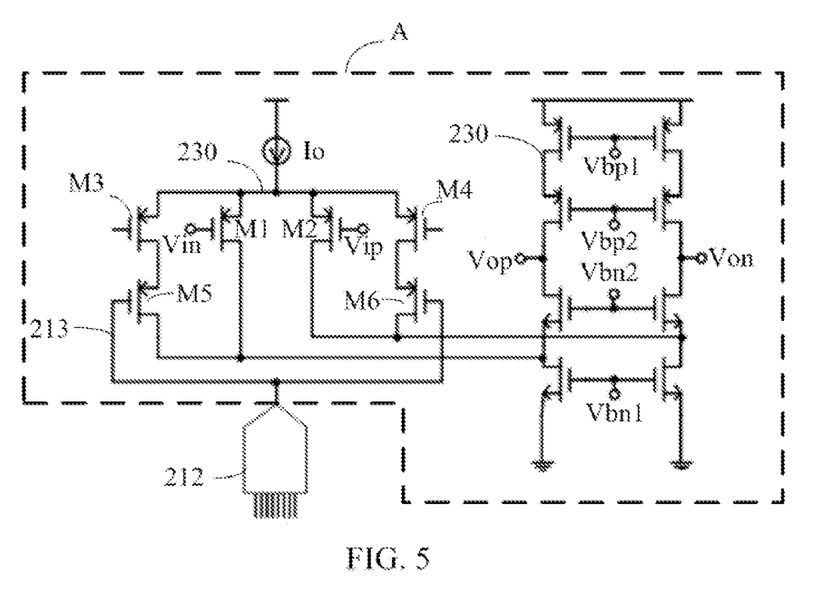
FIG. 5 shows a schematic diagram of the dashed region of the current-steering offset compensation circuit in FIG. 4.

Please refer to FIG. 4 and FIG. 5, wherein FIG. 5 shows a schematic diagram of the dashed region A of the current-steering offset compensation circuit 210 in FIG. 4. In the first embodiment of the present invention, the current-steering circuit 213 of the current-steering offset compensation circuit 210 is posited on an inner circuit of the preamplifier 230. Hence, in the embodiment, the pair of differential output terminals Vop and Von of the acceleration reading circuits 200 output differential values, which passes through the current-steering offset compensation circuit 210, so as to provide a corrective value for compensating the preamplifier 230. However, it will be appreciated that, in another embodiment, the current-steering circuit 213 of the current-steering offset compensation circuit 210 can be posited in the capacitance-to-voltage (C/V) converter circuit or the programmable gain amplifier (PGA).

In the first embodiment of the present invention, the comparator receives the outputs from the pair of differential output terminals Von and Vop of the acceleration reading circuits 200, and detects an offset from the differential outputs, so as to generate a comparison signal which is composed of either "0" or "1", to the digital control unit 211. The digital control unit 211, according the comparison signal of the comparator 214, determines if the current should be compensated to the positive or the negative input terminal of the preamplifier 230, and the amount of the compensation value, so as to generate a digital control signal. The digital control unit 211 transmits the digital control signal to the digital-to-analog converter 212, and controls the input digital code of the digital-to-analog converter 212, so the digital-to-analog converter 212 starts to input a control voltage. When the digital control unit 211 judges that the current should be compensated to the negative terminal of the preamplifier 230, the first transistor M3 is turned on by the digital control unit 211 with the digital control signal. Therefore, the third transistor M5 coupled with the first transistor M3 receives the control voltage, and thus outputs a correction current having a first value. In the same way, when the digital control unit 211 judges that the current should be compensated to the positive terminal of the preamplifier 230, the second transistor M4 is turned on by the digital control unit 211 the digital control signal. Therefore, the fourth transistor M6 coupled with the second transistor M4 receives the control voltage, and thus outputs a correction current having a second value. Finally, when the digital control unit 211 detects that a state transition occurs in the comparison signal of the comparator 214, the correction of the acceleration reading circuits 200 has been completed. That is, the corrective action is stopped; the state of the output from the acceleration reading circuits 200 is stable. The voltages from the pair of differential output terminals Von and Vop will approximate to each other, and the offset of the pair of differential output terminals is nearly 0V.

According to the first embodiment of the present invention, the main elements of the current-steering offset compensation circuit 110 include the current-steering circuit 213 connected with the preamplifier 230, the digital-to-analog converter 212, the comparator 214, and some relevant digital circuits. Hence, the current-steering offset compensation circuit 110 only occupies a small area of the sensor chip. In addition, by controlling the gate voltage of the third transistor M5 or the fourth transistor M6 of the current-steering circuit 213 through the digital-to-analog converter 212, compensation of a tiny offset and wide range of the compensation can be achieved.

Figure 6:
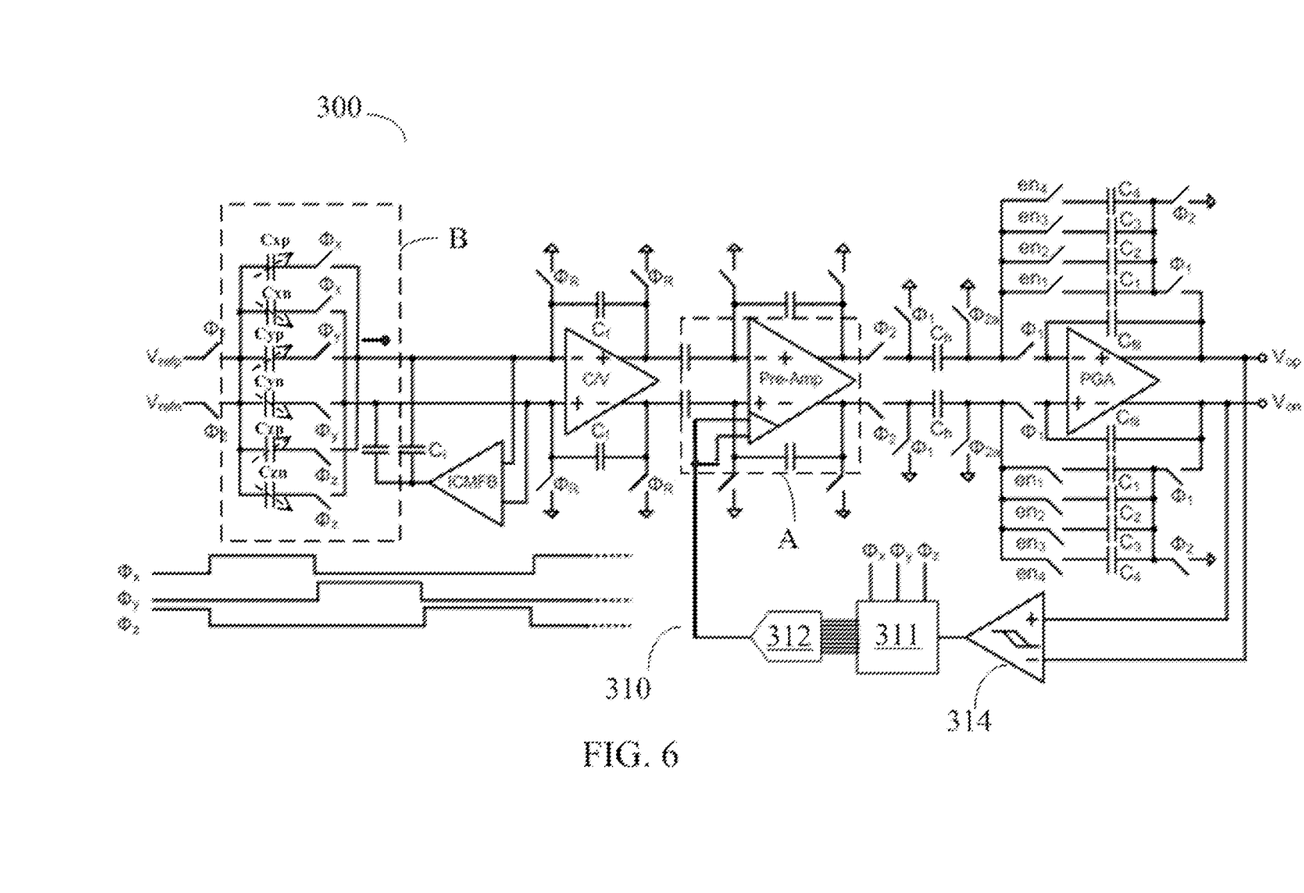
FIG. 6 illustrates a second embodiment of the current-steering offset compensation circuit of the present invention.

Please refer to FIG. 6. FIG. 6 illustrates a second embodiment of the present invention. The three-axis acceleration reading circuits 300 can respectively read the accelerations from the x, y, and z axes. These accelerations are converted to three pairs of differential output capacitances by the three pair of capacitors Cxp, Cxn, Cyp, Cyn, Czp, and Czn (dashed region B) of the front-end of the three-axis acceleration reading circuits 300. The method in which the current-steering offset compensation circuit 310 compensates an offset of the three-axis acceleration reading circuits 300 is similar to that of the first embodiment of the present invention. In the present embodiment, the digital control unit 311 generates a plurality of digital control signals and stores the same. The digital control unit 311 controls an input digital code of the digital-to-analog converter 312 in a sequence (such as x, y, and z), in a time-division multiplexing manner. Hence, the digital-to-analog converter 312 starts to output the control voltage corresponding to one of the three-axis. The current-steering offset compensation circuit 310 controls the relevant correction according to the relevant digital control signal of the digital control unit 311 until the digital control unit 311 judges that a state transition occurs in the comparison signal outputted by the comparator 314. The digital control unit 311 stores these relevant digital control signals, and generates relevant digital control signal when a relevant switch (φx, φy, or φz) of the three pairs of capacitors of the front-end of the three-axis acceleration reading circuits 300 is turned on. According to the embodiments of the present invention, it will be appreciated that the current-steering offset compensation circuit 310 of the present invention can be connected with a plurality of sensors. The plurality of sensors are configured for sensing different physical quantities, such as acceleration or angular velocity, so as to achieve the effect that multiple sensors share the same offset compensation circuit in a time-division multiplexing manner.

Figure 7:
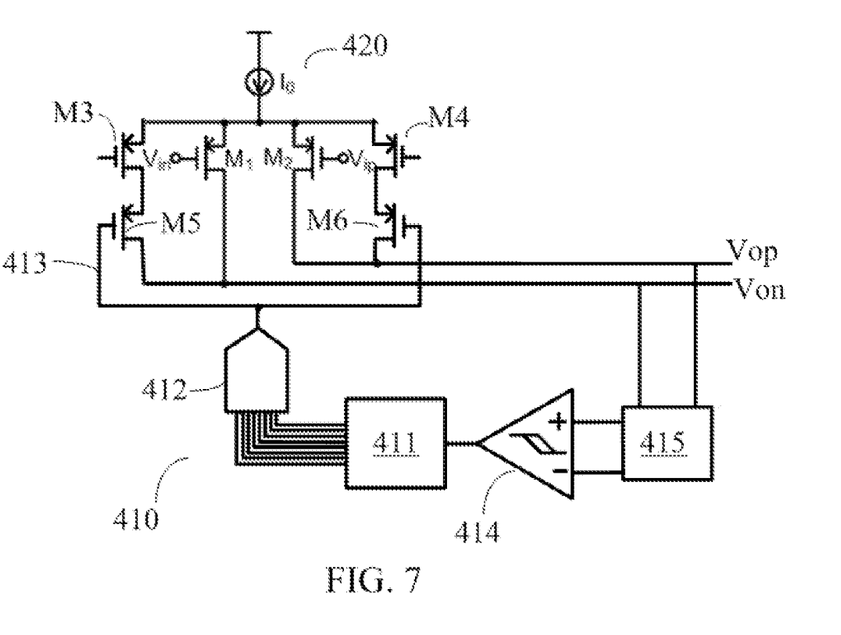
FIG. 7 illustrates a third embodiment of the current-steering offset compensation circuit of the present invention.

Please refer to FIG. 7. FIG. 7 illustrates a third embodiment of the present invention. In the embodiment, the method in which the current-steering offset compensation circuit 410 compensates an offset of the signal processor 420 is similar to the first embodiment of the present invention, wherein the current-steering offset compensation circuit 410 further includes a low pass filter 415. The low pass filter receives the outputs from the pair of differential output terminals Von and Vop of the signal processor 420, and captures the low frequency offset caused by the ambient environment (such as temperature) of the signal processor 420. The low pass filter 415 outputs low frequency differential signals. The comparator 414 receives the low frequency differential signals, and detects an offset within the low frequency differential signals of the low pass filter 415. Hence, the comparator 414 generates a comparison signal which is composed of either "0" or "1", so that the current-steering offset compensation circuit 410 controls the relevant correction current according to the comparison signal.

According to the third embodiment of the present invention, the static offset caused by process variation or the low frequency dynamic offset caused by ambient environment variation (temperature) is captured by the low pass filter 415. After the low frequency offset is calculated by an algorithm in the digital control unit 411, the effect that the static and dynamic offsets of the signal processor 420 are adaptively compensated is achieved.

Figure 8:
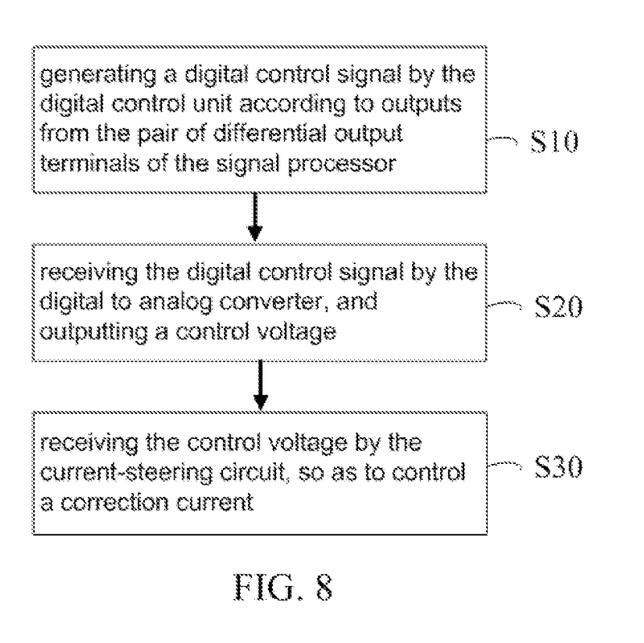
FIG. 8 shows a flow chart of the method for compensating an offset of the present invention.

Please refer to FIG. 8. FIG. 8 shows a flow chart of the method for compensating an offset of the present invention. The flow chart illustrates the steps for compensating a correction current to a signal processor according to the current-steering offset compensation circuit of the present invention. According to the embodiment, the current-steering offset compensation circuit includes a current-steering circuit, a digital control unit, and a digital-to-analog converter. The signal processor includes a pair of differential input terminals and a pair of differential output terminals. Firstly, S10: generating a digital control signal via the digital control unit according to the outputs from the pair of differential output terminals of the signal processor. Secondly, S20: receiving the digital control signal via the digital-to-analog converter, and outputting a control voltage. Finally, S30: receiving the control voltage via the current-steering circuit, so as to control a correction current. The embodiment is used for compensating the static offset of the signal processor caused by the mismatch of the electrode area in the layout process.

Figure 9:
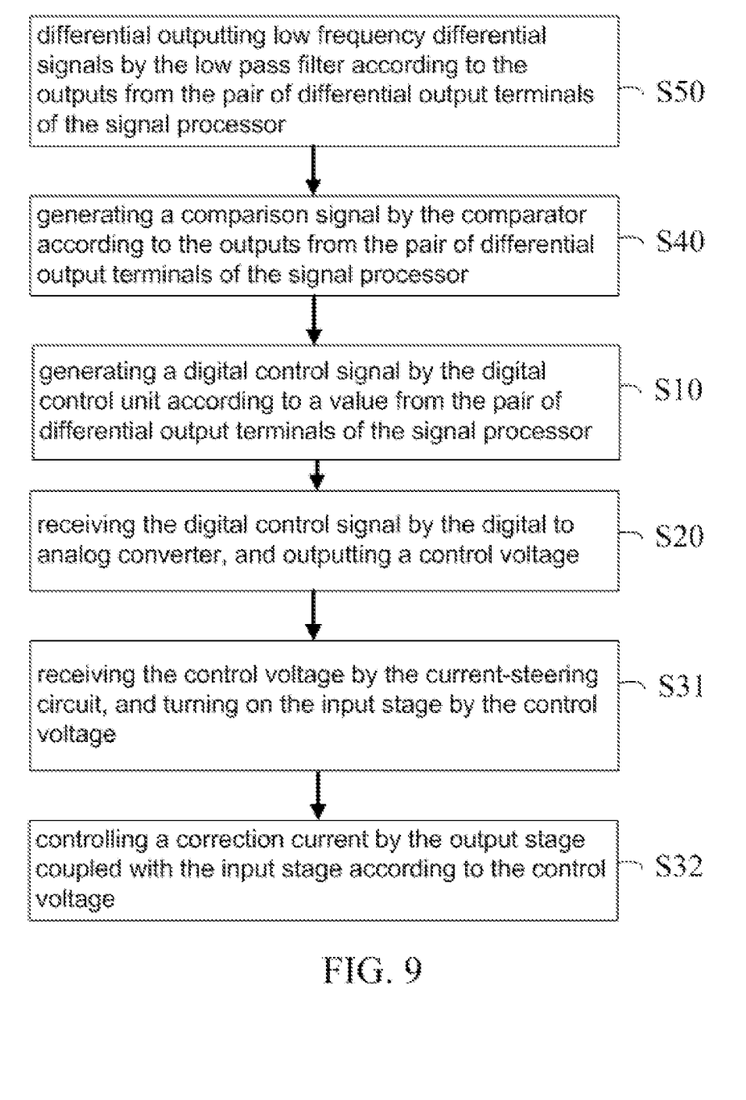
FIG. 9 shows a flow chart of the method for compensating an offset of the third embodiment of the present invention.

Please refer to FIG. 9. FIG. 9 shows a flow chart of the method for compensating an offset of the third embodiment of the present invention. In the embodiment, the current-steering offset compensation circuit further includes a low pass filter and a comparator. The current-steering circuit includes an input stage and an output stage. The method further comprises the following steps: S50, before S10, differential outputting low frequency differential signals via the low pass filter according to the outputs from the pair of differential output terminals of the signal processor. Next, S40: generating a comparison signal via the comparator according to the outputs from the pair of differential output terminals of the signal processor, wherein the outputs which the comparator receives are the low frequency differential signals outputted by the low pass filter. Continuing with the following steps: S10: generating a digital control signal via the digital control unit according to the outputs from the pair of differential output terminals of the signal processor. S20: receiving the digital control signal via the digital-to-analog converter, and outputting a control voltage. In S10, the output which the digital control unit receives is the comparison signal outputted by the comparator. Finally, continuing with the following steps: S31: receiving the control voltage via the current-steering circuit, and turning on the input stage by the digital control unit with the digital control signal. S32: controlling a correction current via the output stage coupled with the input stage according to the control voltage. In the embodiment, because the current-steering offset compensation circuit includes the low pass filter, the low frequency offset caused by ambient environment variation (temperature) is captured, and thus achieves the benefit that the static and dynamic offsets of the signal processor are compensated.

What is claimed is:

1. A current-steering offset compensation circuit for compensating a differential offset of a signal processor, which includes a pair of differential input terminals and a pair of differential output terminals, comprising:
   a current-steering circuit connected with the signal processor;
   a digital control unit which generates a digital control signal according to outputs from the pair of differential output terminals of the signal processor; and
   a digital-to-analog converter which receives the digital control signal and outputs a control voltage,
   wherein the current-steering circuit receives the control voltage, so as to control a correction current; and
   wherein the current-steering circuit includes an input stage for receiving the control voltage and an output stage coupled with the input stage for generating the correction current according to the control voltage.

2. The current-steering offset compensation circuit as claimed in claim 1, further comprising a comparator for receiving the outputs of the pair of differential output terminals, and generating a comparison signal to the digital control unit, wherein the digital control unit generates the digital control signal according to the comparison signal.

3. The current-steering offset compensation circuit as claimed in claim 2, wherein the digital control unit stops generating the digital control signal when a state transition occurs in the comparison signal of the comparator.

4. The current-steering offset compensation circuit as claimed in claim 3, wherein the comparison signal is composed of either "0" or "1".

5. The current-steering offset compensation circuit as claimed in claim 1, further comprising a low pass filter for receiving the outputs of the pair of differential output terminals, and outputting low frequency differential signals to the digital control unit, wherein the digital control unit generates the digital control signal according to the low frequency differential signals.

6. The current-steering offset compensation circuit as claimed in claim 1, wherein the signal processor includes an operational amplifier.

7. The current-steering offset compensation circuit as claimed in claim 1, wherein the input stage of the current-steering circuit includes a first transistor and a second transistor, and the output stage of the current-steering circuit includes a third transistor coupled with the first transistor and a fourth transistor coupled with the second transistor, when a voltage outputted by a positive terminal of the pair of the differential output terminals is greater than a voltage outputted by a negative terminal of the pair of the differential output terminals, the first transistor of the input stage is turned on by receiving the control voltage, and thus the third transistor coupled with the first transistor outputs the correction current having a first value according to the control voltage; when the voltage outputted by the negative terminal of the pair of the differential output terminals is greater than the voltage outputted by the positive terminal of the pair of the differential output terminals, the second transistor of the input stage is turned on by receiving the control voltage, and thus the fourth transistor coupled with the second transistor outputs the correction current having a second value according to the control voltage.

8. The current-steering offset compensation circuit as claimed in claim 1, wherein when the signal processor receives outputs from a plurality of pair of differential output terminals, the digital control unit correspondingly generates a plurality of digital control signals, and the digital control unit stores the plurality of digital control signals for compensating the outputs of the pair of differential output terminals in a time-division multiplexing manner.

9. A method for compensating an offset of a signal processor, the signal processor including a pair of differential input terminals and a pair of differential output terminals, comprising a current-steering offset compensation circuit for compensating an offset of the signal processor, and the current-steering offset compensation circuit including a current-steering circuit comprising an input stage and an output stage coupled with the input stage, a digital control unit, and a digital-to-analog converter, the method comprising the following steps:
   S10: generating a digital control signal by the digital control unit according to outputs from the pair of differential output terminals of the signal processor;
   S20: receiving the digital control signal by the digital-to-analog converter, and outputting a control voltage; and
   S30: turning on the input stage of the current-steering circuit by receiving the control voltage, so as to control a correction current by the output stage coupled with the input stage according to the control voltage.

10. The method for compensating an offset as claimed in claim 9, wherein the current-steering offset compensation circuit further includes a comparator, the method further comprising the following step before S10:
   S40: generating a comparison signal by the comparator according to the outputs from the pair of differential output terminals of the signal processor.

11. The method for compensating an offset as claimed in claim 10, wherein the digital control unit stops generating the digital control signal when a state transition occurs in the comparison signal of the comparator.

12. The method for compensating an offset as claimed in claim 10, wherein the current-steering offset compensation circuit further includes a low pass filter, the method further comprising the following step before S40:

S50: differential outputting low frequency differential signals by the low pass filter according to the outputs from the pair of differential output terminals of the signal processor.

13. The method for compensating an offset as claimed in claim 9, wherein the input stage includes a first transistor and a second transistor, and the output stage includes a third transistor coupled with the first transistor and a fourth transistor coupled with the second transistor; when a voltage outputted by a positive terminal of the pair of the differential output terminals is greater than a voltage outputted by a negative terminal of the pair of the differential output terminals, the first transistor is turned on by the receiving the control voltage, and thus the third transistor coupled with the first transistor outputs the correction current having a first value according to the control voltage; when the voltage outputted by the negative terminal of the pair of the differential output terminals is greater than the voltage outputted by the positive terminal of the pair of the differential output terminals, the second transistor is turned on by receiving the control voltage, and thus the fourth transistor coupled with the second transistor outputs the correction current having a second value according to the control voltage.

* * * * *